United States Patent
Lee et al.

(10) Patent No.: US 7,051,792 B2
(45) Date of Patent: May 30, 2006

(54) HEAT DISSIPATION DEVICE

(75) Inventors: Hsieh Kun Lee, Tu-Chen (TW); Cui Jun Lu, Shenzhen (CN); MingXian Sun, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/920,493

(22) Filed: Aug. 17, 2004

(65) Prior Publication Data

US 2005/0103474 A1    May 19, 2005

(30) Foreign Application Priority Data

Oct. 28, 2003   (TW)   .............................. 92219093 U

(51) Int. Cl.
   *F28D 15/00*   (2006.01)
   *H05K 7/20*   (2006.01)

(52) U.S. Cl. ................ 165/104.21; 165/80.3; 165/104.33; 361/700

(58) Field of Classification Search ................ 165/185, 165/80.3, 104.21, 104.26, 104.33, 104.34; 361/697, 700, 702, 704; 257/714, 715; 174/15.2, 174/16.3

See application file for complete search history.

(56) References Cited

U.S. PATENT DOCUMENTS

| | | | |
|---|---|---|---|
| 5,901,040 A | * | 5/1999 | Cromwell et al. .......... 361/704 |
| 6,189,601 B1 | * | 2/2001 | Goodman et al. ......... 165/80.3 |
| 6,199,625 B1 | | 3/2001 | Guerrero |
| 6,382,306 B1 | * | 5/2002 | Hsu .......................... 165/80.3 |
| 6,625,021 B1 | * | 9/2003 | Lofland et al. ............. 361/697 |
| 6,779,595 B1 | * | 8/2004 | Chiang ................. 165/104.33 |
| 2003/0209342 A1 | * | 11/2003 | Hsin et al. ................. 165/80.3 |

FOREIGN PATENT DOCUMENTS

| | | |
|---|---|---|
| CN | 2500070 Y | 7/2002 |
| TW | 520146 | 2/2003 |
| TW | 534379 | 5/2003 |

* cited by examiner

*Primary Examiner*—Tho Duong
(74) *Attorney, Agent, or Firm*—Wei Te Chung

(57) ABSTRACT

A heat dissipation device includes a base (10) having a heat dissipating surface, a plurality of fins (20) and a pair of heat pipes (30). The fins cooperatively define a concave tunnel in a side thereof. The heat dissipating surface of the base is embedded in the tunnel of the fins. Each heat pipe has a vaporizing portion (32) engaged with the base and a condensing portion (31) engaged in the fins.

8 Claims, 2 Drawing Sheets

HEAT DISSIPATION DEVICE

BACKGROUND OF THE INVENTION

1. Field of the Invention

The present invention relates to heat dissipation devices for removing heat from electronic components, and more particularly to a heat pipe type heat dissipation device.

2. Description of Related Art

Conventional heat dissipation devices used for removing heat from electronic components are mostly formed by extrusion of metallic material. Such kind of heat dissipation device commonly comprises a base, and a plurality of fins integrally extending from the base. The fins are relatively thick in comparison with distances defined between each two adjacent fins, due to inherent limitations in extrusion technology. This restricts the number of the fins that can be formed, and a total heat dissipation area that can be provided by the fins. Furthermore, a height of the fins is limited to about 13 times the distance between each two adjacent fins, also due to inherent limitations in extrusion technology.

In order to keep pace with these developments in electronics technology, assembled heat dissipation devices have been gaining in popularity. For example, China Patent No. 2462641Y provides an assembled heat dissipation device having a plurality of uniformly dimensioned individual plate fins evenly stacked together. This heat dissipation device can provide a large total heat dissipation area. However, the fins are connected together only by the attachment of the tabs of each fin in the indents of the adjacent fin. The fins are prone to be disengaged from each other when the heat dissipation device is subjected to shock or vibration during transportation or in operation. Part of or even the entire stack of fins may collapse.

With the continuing boom in electronics technology, numerous modern electronic components such as central processing units (CPUs) of computers can operate at very high speeds and thus generate large amounts of heat. The heat must be efficiently removed from the CPU; otherwise, abnormal operation or damage may result. The conventional heat removal way merely by conduct of heat is increasingly no longer able to adequately remove heat from these contemporary electronic components.

Meanwhile, heat pipes have been generally applied to enhance heat removal efficiency. Commonly, a heat dissipation device has a small heat pipe perpendicularly inserted into a base and a plurality of spaced fins individually perpendicularly engaged with the heat pipe. However, the engagement of the heat pipe with the base is limited by the thickness of the base. The dimension of the heat pipe limits the total contacting area between the heat pipe and the fins. Though the heat pipe inherently has a great heat-transfer capability, the heat dissipation device is not yet facilitated to remove heat from the CPU.

SUMMARY OF THE INVENTION

Accordingly, an object of the present invention is to provide a heat dissipation device which optimizes the heat removal capability of the heat dissipation device.

In order to achieve the object set out above, a heat dissipation device in accordance with a preferred embodiment of the present invention comprises a base having a heat dissipating surface, a plurality of fins and a pair of heat pipes. The fins cooperatively define a concave tunnel in a side thereof. The heat dissipating surface of the base is embedded in the tunnel of the fins. Each heat pipe has a vaporizing portion engaged with the base and a condensing portion engaged in the fins.

Other objects, advantages and novel features of the present invention will become more apparent from the following detailed description when taken in conjunction with the accompanying drawings, in which:

DETAILED DESCRIPTION OF THE INVENTION

Figure 1:
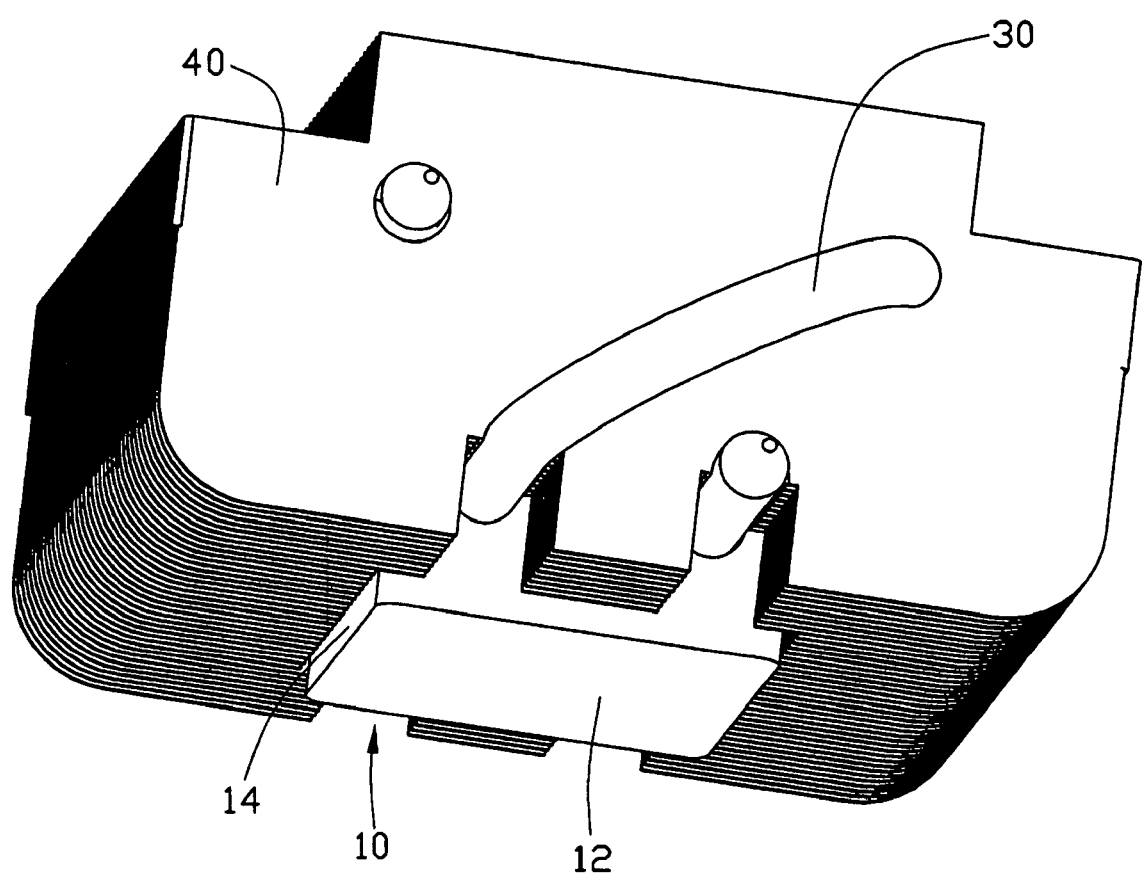
FIG. 1 is an assembled, isometric view of a heat dissipation device in accordance with the preferred embodiment of the present invention.
Figure 2:
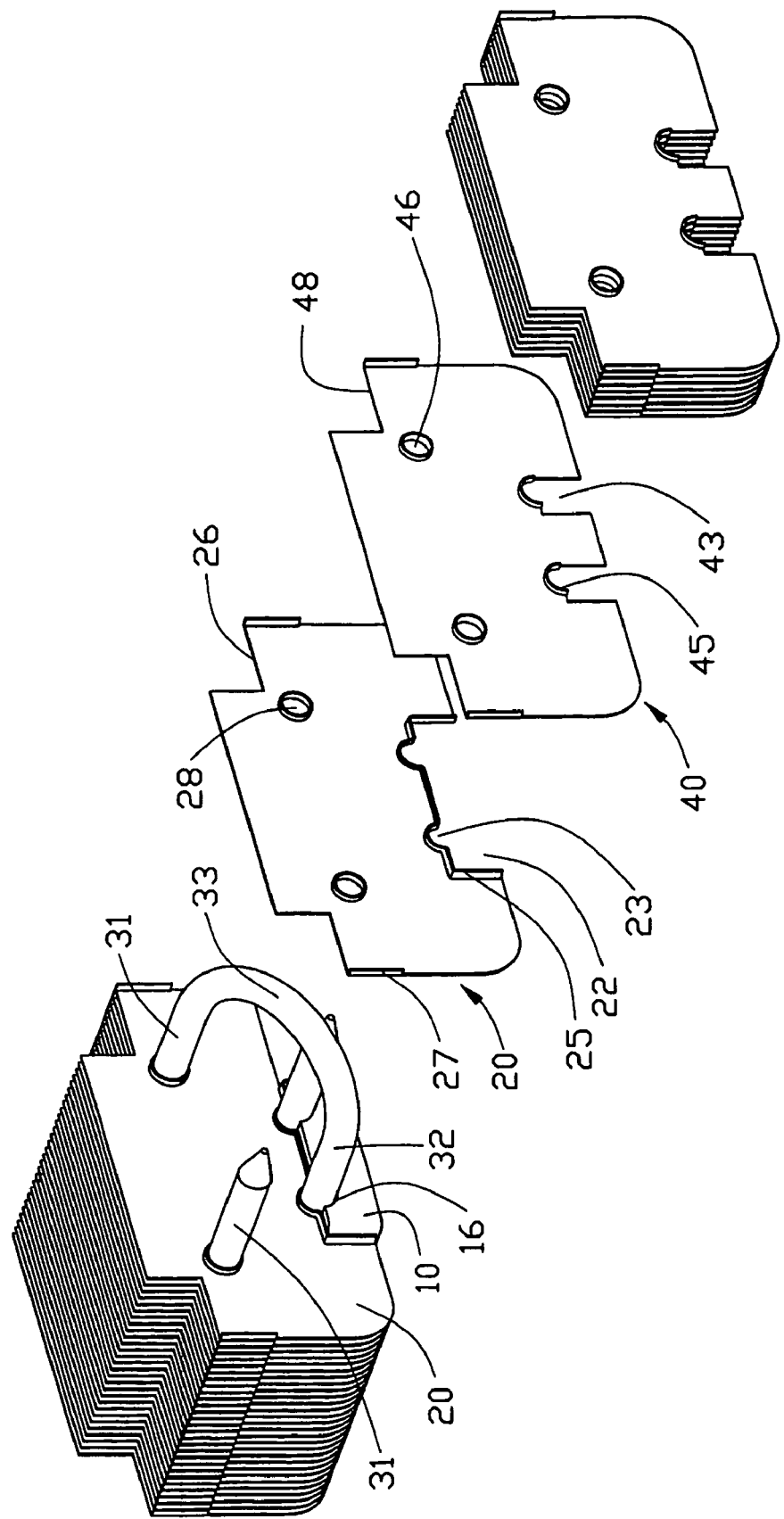
FIG. 2 is a partly exploded view of the heat dissipation device of FIG. 1.

Referring to FIGS. 1–2, a heat dissipation device in accordance with the preferred embodiment of the present invention comprises a base 10, a plurality of fins 20 spanning the base 10, and a pair of heat pipes 30.

The base 10 comprises a first surface 12 for contacting an electronic component (not shown), a second surface (not labeled) opposing to the first surface 12 and a pair of sidewalls 14 between the first and second surfaces. A pair of semi-cylindrical channels 16 is defined in the second surface of the base 10 along a direction parallel to the sidewalls 14.

Each fin 20 defines an undercut 22 facing the second surface of the base 10, so that the fin 20 can span on the base 10 traversing the channels 16 and engaging with the second surface and the opposite sidewalls 14 of the base 10. A pair of semi-circular cutouts 23 is further defined in each fin 20 in communication with the undercut 22. The cutouts 23 correspond to the channels 16 of the base 10, for receiving the heat pipes 30 therebetween. A continuous bent flange 25 is formed from each fin 20 at the undercut 22 and the cutouts 23. The bent flange 25 provides a large thermal contact area between each fin 20 and the second surface and the sidewalls 14 of the base 10, and provides a large thermal contact area between each fin 20 and the heat pipes 30 at the cutouts 23. A step 26 is formed at each of opposite sides of each fin 20. A reinforcing flange 27 is formed at opposite outmost edges of each fin 20 beneath the steps 26, for enhancing strength of the fin 20. A pair of slots 28 is defined in each fin 20 separated from the cutouts 23 for receiving the heat pipes 30.

Each heat pipe 30 has a U-shaped configuration and comprises a condensing portion 31, a vaporizing portion 32, and a middle portion 33 between the condensing portion 31 and the vaporizing portion 32.

For enhancing heat dissipation capability of the heat dissipation device, a plurality of fins 40 is provided. Each fin 40 is similar to the fins 20. However, the fins 40 do not span the base 10, but are disposed at opposite sides of the base 10 parallel to the fins 20. Each fin 40 has a pair of cutouts 43 for receiving the heat pipes 30, bent flanges 45 at the cutouts 43, and a pair of steps 48 at opposite sides thereof, and further a pair of slots 46 for receiving the heat pipes 30.

In the heat dissipation device, the condensing portions 31 of the heat pipes 30 are inserted into the slots 28, 46 of the fins 20, 40. The vaporizing portions 32 of the heat pipes 30 are received in the channels 16 of the base 10 and the cutouts 23, 43 of the fins 20, 40. The undercuts 22 of the fins 20 cooperatively define a concave tunnel (not labeled) for embedding the second surface and the sidewalls 14 of the base 10 therein. The bent flanges 25 of the fins 20 cooperatively form a hear absorbing surface (not labeled) to absorb heat from the second surface and the sidewalls 14 of the base 10. The steps 26, 48 of the fins 20, 40 cooperatively form a shoulder at respective opposite sides of the heat dissipation device for supporting clips (not shown) thereon. The base 10 has its bottom portion exposed beyond the fins 20, 40, so that there is no interference between the fins 20, 40 and electronic components (not shown) near the electronic component to be cooled by the heat dissipation device.

In the preferred embodiment of the present inventions, each heat pipe 30 is engaged with intersecting cutout 23/43 and the slot 28/46, that is, projections of the heat pipes 30 based on the fins 20 are intersectant. The heat pipes 30 are engaged with the fins 20, 40 from opposite sides of the heat dissipation device, that is, the middle portions 33 of the heat pipes 30 are disposed at opposite sides of the heat dissipation device. In fact, the arrangement of the heat pipes 30 is not limited to the illustration shown in the FIGS 1–2, and can be modified according to actual requirements.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
    a base comprising a heat dissipating surface;
    a fin assembly comprising a plurality of fins and defining a concave tunnel in a side thereof; and
    two heat pipes having vaporizing portions engaged with the base, and condensing portions engaged in the fins;
    wherein the heat dissipating surface of the base is embedded in the tunnel of the fin assembly, and wherein the heat pipes are so arranged that their projections based on the fins are intersectant.

2. The heat dissipation device of claim 1, wherein the base defines channels therein the fins define cutouts facing the channels, and wherein the vaporizing portions of the heat pipes are received in the channels and the cutouts.

3. The heat dissipation device of claim 1, wherein the fins form flanges facing the base, the flanges covering the vaporizing portions of the heat pipes and said heat dissipating surface of the base.

4. The heat dissipation device of claim 1, wherein the fins define slots therein distant from the base, and wherein the condensing portions of the heat pipes are received in the slots.

5. The heat dissipation device of claim 1, wherein each of the heat pipes further comprises a middle portion between the vaporizing portion and the condensing portion.

6. The heat dissipation device of claim 5, wherein the middle portions of the heat pipes are disposed at opposite sides of the heat dissipation device.

7. The heat dissipation device of claim 1, wherein the base is disposed beyond the fins at a side opposing to the fins.

8. The heat dissipation device of claim 1, wherein the fins form reinforcing flanges at opposite sides thereof.

* * * * *